US010312188B1

(12) United States Patent
Srivastava et al.

(10) Patent No.: US 10,312,188 B1
(45) Date of Patent: Jun. 4, 2019

(54) INTERCONNECT STRUCTURE WITH METHOD OF FORMING THE SAME

(71) Applicant: GLOBALFOUNDRIES INC., Grand Cayman (KY)

(72) Inventors: Ravi P. Srivastava, Clifton Park, NY (US); Sunil K. Singh, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/867,894

(22) Filed: Jan. 11, 2018

(51) Int. Cl.
| | | |
|---|---|---|
| *H01L 21/768* | (2006.01) | |
| *H01L 23/485* | (2006.01) | |
| *H01L 23/522* | (2006.01) | |
| *H01L 23/528* | (2006.01) | |
| *H01L 23/532* | (2006.01) | |

(52) U.S. Cl.
CPC .... *H01L 23/5226* (2013.01); *H01L 21/76814* (2013.01); *H01L 21/76843* (2013.01); *H01L 23/485* (2013.01); *H01L 23/528* (2013.01); *H01L 23/53238* (2013.01)

(58) Field of Classification Search
CPC ..... H01L 43/08; H01L 51/56; H01L 51/5072; H01L 51/0072; H01L 43/10
USPC ........................................................ 257/774
See application file for complete search history.

(56) References Cited

U.S. PATENT DOCUMENTS

| | | | |
|---|---|---|---|
| 9,305,878 B2 | 4/2016 | Huisinga et al. | |
| 9,373,541 B2 | 6/2016 | Chen et al. | |
| 9,576,901 B1 | 2/2017 | Chen et al. | |
| 9,613,862 B2 | 4/2017 | Lenhardt et al. | |
| 9,685,366 B1 | 6/2017 | Briggs et al. | |
| 2006/0121721 A1* | 6/2006 | Lee | H01L 21/76808 438/618 |
| 2006/0178002 A1* | 8/2006 | Kim | H01L 21/31144 438/622 |
| 2007/0082477 A1* | 4/2007 | Naik | H01L 21/76808 438/622 |

* cited by examiner

*Primary Examiner* — Andy Huynh
(74) *Attorney, Agent, or Firm* — Anthony Canale; Hoffman Warnick LLC

(57) ABSTRACT

An integrated circuit (IC) structure including an interconnect structure is disclosed. The interconnect structure may include a first etch stop layer (ESL) positioned between an initial via layer and a first metal layer of the interconnect structure. The ESL may be positioned adjacent to and surround a metal wire in the first metal layer. A method of forming an interconnect structure is also disclosed. The method may include forming an opening in a first dielectric layer above a substrate; forming a sacrificial semiconductor material in the opening; forming an ESL on the first dielectric layer and sacrificial semiconductor material; forming a second dielectric layer on the ESL; forming an opening in the second dielectric layer to expose a portion of the ESL; removing the exposed portion of the ESL; removing the sacrificial semiconductor material; and forming a conductive material in the openings to form an interconnect structure.

17 Claims, 5 Drawing Sheets

INTERCONNECT STRUCTURE WITH METHOD OF FORMING THE SAME

BACKGROUND

The present disclosure relates to integrated circuit (IC) fabrication, and more specifically, to an interconnect structure and a method for forming the same.

Integrated circuit (IC) chips can include billions of interconnected devices, such as transistors, resistors, capacitors, and diodes, etc., located in layers of materials. The quality and viability of an IC chip is partially dependent on the techniques used for fabricating and packaging the IC chips and the structure of various components therein. Fabrication of an IC chip can include two phases: front-end-of-line processes (FEOL) and back-end-of-line processes (BEOL). FEOL generally includes fabrication processes performed on a wafer up to and including the formation of gate materials (e.g., a polysilicon gate) for a transistor structure. A group of vertically-extending conductive contacts can provide electrical connections to the transistor from other functional elements of a circuit. BEOL generally includes fabrication processes following the formation of materials in FEOL processing, including the formation of interconnect structures for connecting the devices therebelow. An interconnect structure can include a multitude of stacked and electrically connected metal structures positioned in metal levels. For example, an interconnect structure can include metal wires oriented parallel to the semiconductor substrate in metal wire layers. The interconnect structure may further include metal vias oriented perpendicular to the semiconductor substrate in via layers between the metal wire for connecting the metal wires of various layers.

Efficient routing of interconnects, across semiconductor devices, requires formation of multi-level patterning schemes, such as single or dual damascene interconnect structures. For example, in single damascene processes for forming interconnect structures a via layer, also known as an inter-level dielectric (ILD) region, may be formed including metal vias therein, and subsequently a metal wire layer may be separately formed above the via layer including metal wires contacting the metal vias therebelow. In contrast, in dual damascene processes for forming interconnect structures, openings for the vias and wires may be formed in such a way that the conductive metal material fills the via and wire openings during the same deposition process to form the metal wires and metal vias.

One challenge associated with conventional dual- and single- damascene processes for forming interconnect structures is the lack of control over the etch profile between the metal wire and metal via structures. For example, it may be difficult to control the depth of the wire opening with respect to the via opening therebelow. Additionally, during the formation of the wire opening, etching of the exposed upper portions of the via opening may cause chamfering of the via opening sidewalls. Another challenge associated with the conventional dual-damascene formation of interconnect structures may include damage caused to exposed structures underlying the via opening during the removal of the hard mask used to form the via and wire openings.

SUMMARY

A first aspect of the disclosure is directed to a method including: forming a first dielectric layer above a substrate; forming a via opening in the first dielectric layer; filling the via opening with a sacrificial semiconductor material; forming a first layer on the first dielectric layer and the sacrificial semiconductor material; forming a second dielectric layer on the first layer; forming a wire opening in the second dielectric layer to expose a portion of the first layer, the wire opening positioned above the sacrificial semiconductor material in the first dielectric layer; removing the exposed portion of the first layer to expose an upper surface of the sacrificial semiconductor material; removing the sacrificial semiconductor material from the via opening; and forming a conductive material in the via opening and the wire opening to form an interconnect structure.

A second aspect of the disclosure includes a method of forming an interconnect, the method including: forming a first dielectric layer above a substrate forming a first via in the first dielectric; forming a second dielectric layer above the first dielectric layer; forming a via opening in the second dielectric layer above the first via; forming a sacrificial semiconductor material in the via opening; forming a first layer on the second dielectric layer and the sacrificial semiconductor material; forming a third dielectric layer on the first layer; forming a wire opening in the third dielectric layer to expose a portion of the first layer, the wiring opening positioned above the sacrificial semiconductor material; removing the exposed portion of the first layer to expose the sacrificial semiconductor material; removing the sacrificial semiconductor material from the via opening to expose an upper surface of the first via in the first dielectric layer; and forming a conductive material in the via opening and the wiring opening to form the interconnect structure on the first via, the interconnect structure including a second via and a first wire.

A third aspect of the disclosure is related to an integrated circuit (IC) structure including: a first via positioned in a first dielectric layer above a substrate; a second dielectric layer positioned above the first dielectric layer, the second dielectric layer including a second via, wherein a bottom extent of the second via contacts an upper extent of the first via; a third dielectric layer positioned above the second dielectric layer, the third dielectric layer including a metal wire, wherein a bottom extent of the metal wire contacts an upper extent of the second via; and a first layer positioned between the second dielectric layer and the third dielectric layer adjacent to the metal wire, the first layer surrounding a lower portion of the metal wire, and wherein a bottom extent of the first layer is substantially coplanar with the bottom extent of the metal wire.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Embodiments of the present disclosure provide a method for forming an interconnect structure including forming an etch stop layer (ESL) on a via layer before forming a metal wire layer thereabove. Embodiments of the present disclosure may allow for formation of a substantially chamferless via. Embodiments of the present disclosure may also prevent and/or mitigate damage to structures underlying the metal wire layer during formation thereof.

Figure 1:
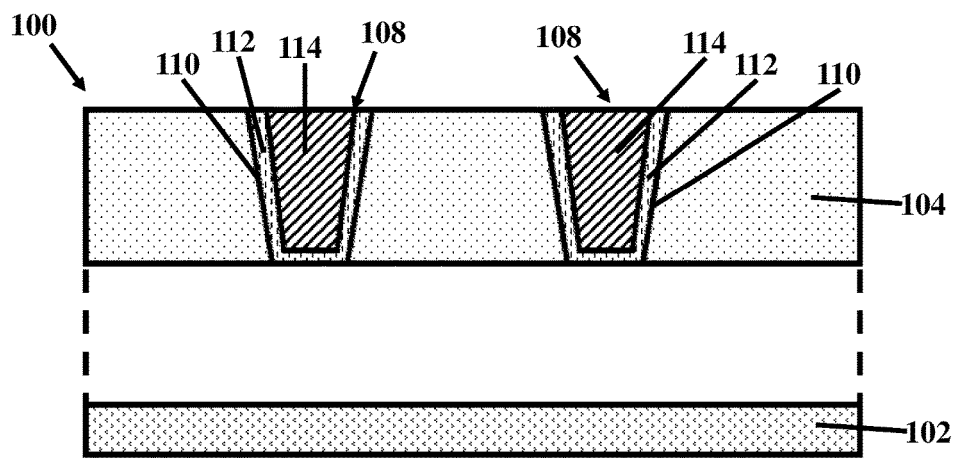
FIG. 1 shows a cross-sectional view of an initial structure, according to embodiments of the disclosure.

Turning to the drawings, FIG. 1 show an initial structure 100 for forming interconnect structures, according to embodiments of the disclosure. FIG. 1 shows a perspective view of initial structure 100. As shown in FIG. 1, initial structure may include a first dielectric layer 104 positioned above a substrate 102. Substrate 102 may be formed using any now known or later developed semiconductor fabrication techniques for forming a substrate. Substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity).

Furthermore, a portion or entirety of each layer may be strained. Although not shown, substrate 102 may alternatively include a silicon-on-insulator (SOI) substrate formed by conventional semiconductor techniques for forming an SOI substrate.

As discussed above, first dielectric layer 104 may be formed above substrate 102. Via structures may be subsequently formed within the first dielectric layer for interconnecting various structures (not shown). The broken lines between substrate 102 and dielectric layer 104 generically illustrate a device layer, which may include any number of transistors, resistors, capacitors, diodes, etc., according to any currently known or later developed architecture. The dotted lines between substrate 102 and first dielectric layer 104 in FIG. 1 therefore may represent any number of layers including any number and type of device structures may be positioned between first dielectric layer 104 and substrate 102. Materials used for first dielectric layer 104 may include but are not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

First dielectric layer 104 may be formed by deposition and/or any other conventional semiconductor fabrication techniques for forming a dielectric layer. As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

As also shown in FIG. 1, first dielectric layer 104 of initial structure 100 may include first via structures or contact structures 108 positioned therein. First via structures 108 may electrically connect a subsequently formed interconnect structure to one or more device structures positioned therebelow. For example, although not shown, each first via structure 108 may electrically connect a gate of a transistor positioned in a device layer between substrate 102 and first dielectric layer 104 to an interconnect structure. In the case of non-transistor elements, each via structure 108 may electrically connect overlying metal layers to the terminal of one or more devices on substrate 102. First via structures 108 may be formed by conventional semiconductor fabrication techniques for forming a via structures in a dielectric layer. For example, first via structures 108 may be formed by etching first via openings 110 in first dielectric layer 104, forming a barrier metal liner 112 in first via openings 110, forming a conductive material 114 on barrier metal liner 112, and planarizing first via structures 108 with the upper surface of first dielectric layer 104. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. Barrier metal liner 112 may include conventional barrier metal liner material such as titanium nitride (TiN), tantalum nitride (TaN), cobalt (Co), or ruthenium (Ru) and/or any other refractory metals such as tantalum (Ta), titanium (Ti), tungsten (W), iridium (Jr), rhodium (Rh) and platinum (Pt), etc., and/or mixtures thereof. Conductive material 114 may include tungsten and/or any other now known or later developed conductive materials for a via or contact structure. Planarizing first via structures 108 may include, for example, chemical mechanical planarization (CMP).

Figure 2:
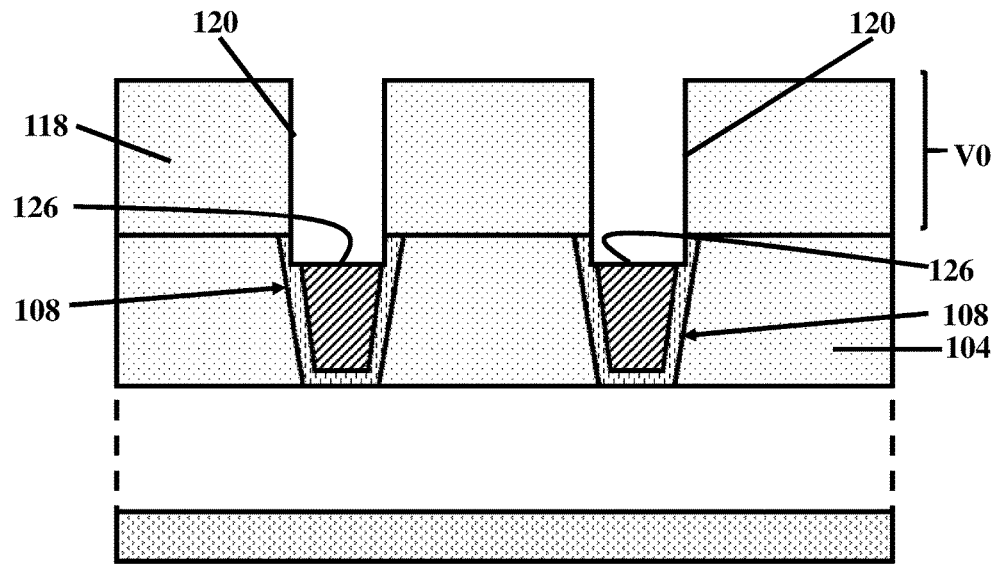
FIG. 2 shows a cross-sectional view of forming a dielectric layer including and via openings for an initial via layer on the initial structure of FIG. 1, according to embodiments of the disclosure.

Turning now to FIG. 2, forming via openings 120 in an initial via layer V0 of an interconnect structure on first dielectric layer 104 is shown, according to embodiments of the disclosure. Initial via layer V0 may include a second dielectric layer 118 formed on first dielectric layer 104 including first via structures 108. Second dielectric layer 118 may be formed by the same and/or similar methods and materials as discussed above with respect to first dielectric layer 104 of FIG. 1, or may include any currently known or later developed insulator material.

As also shown in FIG. 2, second via openings 120 may be formed within second dielectric layer 118 above first via structures 108. Second via openings 120 may be formed for second via structures 150 (FIG. 7) of initial via structure V0. As also shown in FIG. 2, forming second via openings 120 may expose an upper portions 126 of first via structures 108 for electrically connecting subsequently formed second via openings 120 therewith. Second via openings 120 may be formed by the same and/or similar methods as described above with respect to via openings 110 of FIG. 1.

Figure 3:
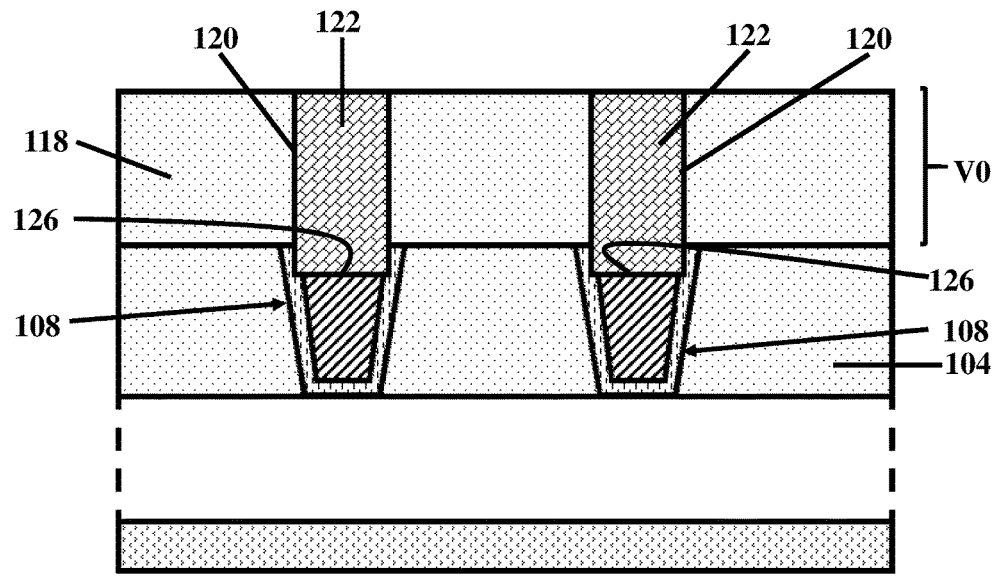
FIG. 3 shows forming a sacrificial semiconductor material in the via openings of FIG. 2, according to embodiments of the disclosure.

Turning next to FIG. 3, forming a sacrificial semiconductor material 122 within second via openings 120 is shown. Sacrificial semiconductor material 122 may be formed in second via openings 120 to protect first via structures 108, and second via openings 120 during subsequent processing for forming a metal wire layer above initial via layer V0. As will be discussed herein, sacrificial semiconductor material 122 may allow for overlaying structures to be formed above initial via layer V0 and eventually allow for portions of the semiconductor to be re-exposed for metal formation within via openings 120. For example, sacrificial semiconductor material 122 may be formed for subsequent replacement with a conductive for second via structures 150 (FIG. 7) of initial via layer V0. Sacrificial semiconductor material 122 may be formed in second via openings 120 by conventional semiconductor fabrication techniques for forming sacrificial semiconductor material in an opening. For example, sacrificial semiconductor material 122 may be formed by deposition and CMP with the upper surface of second dielectric layer 118. Sacrificial semiconductor material 122 may include spin-on hard mask (SOH), spin-on glass (SOG), organic planarization layer (OPL) material and/or any other now known or later developed sacrificial semiconductor materials.

Figure 4:
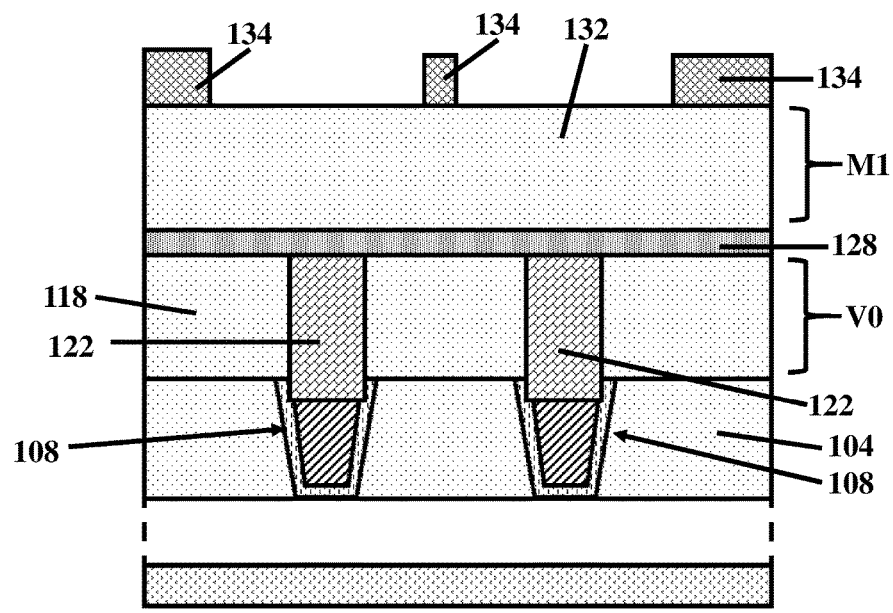
FIG. 4 shows a cross-sectional view of forming an etch stop layer (ESL) and another dielectric layer for a first metal layer on the dielectric layer of FIG. 2, according to embodiments of the disclosure.

Turning next to FIG. 4, in contrast to conventional interconnect formation, forming a first etch stop layer (ESL) 128 on initial via layer V0 before forming a first metal wire layer is shown, according to embodiments of the disclosure. As will be discussed further herein, first ESL 128 may protect initial via layer V0 and first via structures 108 during the formation of a first metal wire layer thereabove. First ESL 128 may be formed by deposition, and/or any other now known or later developed semiconductor fabrication techniques for forming an etch stop layer. First ESL 128 may include aluminum nitride (AlN), aluminum oxide (AlO), aluminum oxynitride, amorphous silicon (a-Si), silicon carbide (SiC), $N_2$-doped SiC, barrier low k (BloK) material, $N_2$-doped BloK material, low temperature oxide (LTO), and/or any other now known or later developed materials for an ESL.

As also shown in FIG. 4, after forming first ESL 128, a third dielectric layer 132 for a first metal wire layer M1 may be formed on first ESL 128. Third dielectric layer 132 may be formed by the same and/or similar materials and methods as first dielectric layer 104 of FIG. 1, or may include any currently known or later developed electrically insulating material. As further shown in FIG. 4, a patterned mask 134 may be formed on third dielectric layer 132 for forming a pattern of openings therein for metal wires. Patterned mask 134 may be formed by conventional semiconductor fabrication techniques for forming a patterned mask layer. For example, patterned mask 134 may be formed by deposition and developing. Patterned mask 134 may include titanium nitride (TiN) and/or any other now known or later developed mask layer material.

Figure 5:
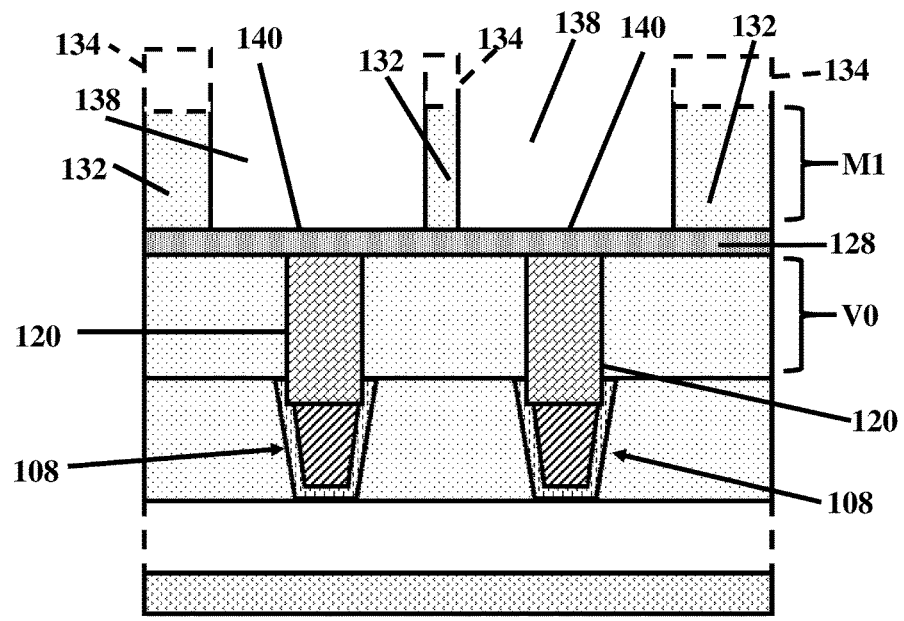
FIG. 5 shows a cross-sectional view of forming metal wire openings in the dielectric layer of FIG. 4, according to embodiments of the disclosure.

Turning next to FIG. 5, forming metal wire openings 138 in third dielectric layer 132 using patterned mask 134 (in phantom) is shown, according to embodiments of the disclosure. As will be discussed herein, metal wire openings 138 may be subsequently filled with a conductive material to form metal wires of an interconnect structure. Metal wire openings 132 may be formed, for example, by etching exposed portions of third dielectric layer 132 not covered by patterned mask 134. As shown in FIG. 5, forming metal wire openings 132 may expose upper portions 140 of first ESL 128. In contrast to conventional interconnect formation, first ESL 128 may act as an etch stop for forming openings 132 which may also prevent second via openings 120 and/or first via structures 108 therebelow from being removed, etched, altered, etc., during the etching process.

As also shown in FIG. 5, patterned mask 134 (in phantom) may be removed after metal wire openings 138 have been formed. Removing patterned mask 134 (in phantom) may include conventional semiconductor fabrication techniques for removing a semiconductor mask. For example, patterned mask 134 may be removed by etching. In contrast to conventional interconnect formation processes, first ESL 128 may prevent and/or mitigate damage to second via openings 120 and/or first via structures 108 therebelow during the removal of patterned mask 134 (in phantom).

Figure 6:
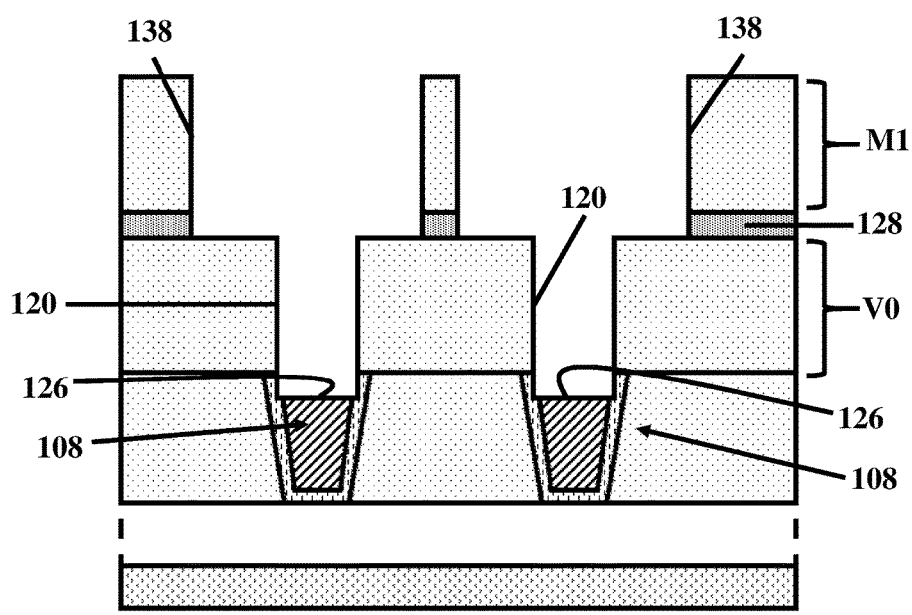
FIG. 6 shows a cross-sectional view of removing a portion of the ESL and the sacrificial semiconductor material, according to embodiments of the disclosure.

Turning next to FIG. 6, removing exposed portions 140 (FIG. 5) of first ESL 128, and sacrificial semiconductor material 122 (FIG. 5) to re-expose upper portions 126 of first via structures 108 is shown, according to embodiments of the disclosure. As will be discussed herein, exposed portions of first ESL 128, and sacrificial semiconductor material 122 (FIG. 5) may be subsequently replaced by a conductive material to form an interconnect structure electrically connected to first via structures 108. Exposed portions 140 (FIG. 5) of first ESL 128, and sacrificial semiconductor material 122 may be removed by etching and/or any other conventional semiconductor fabrication techniques for removing the respective materials of each.

Figure 7:
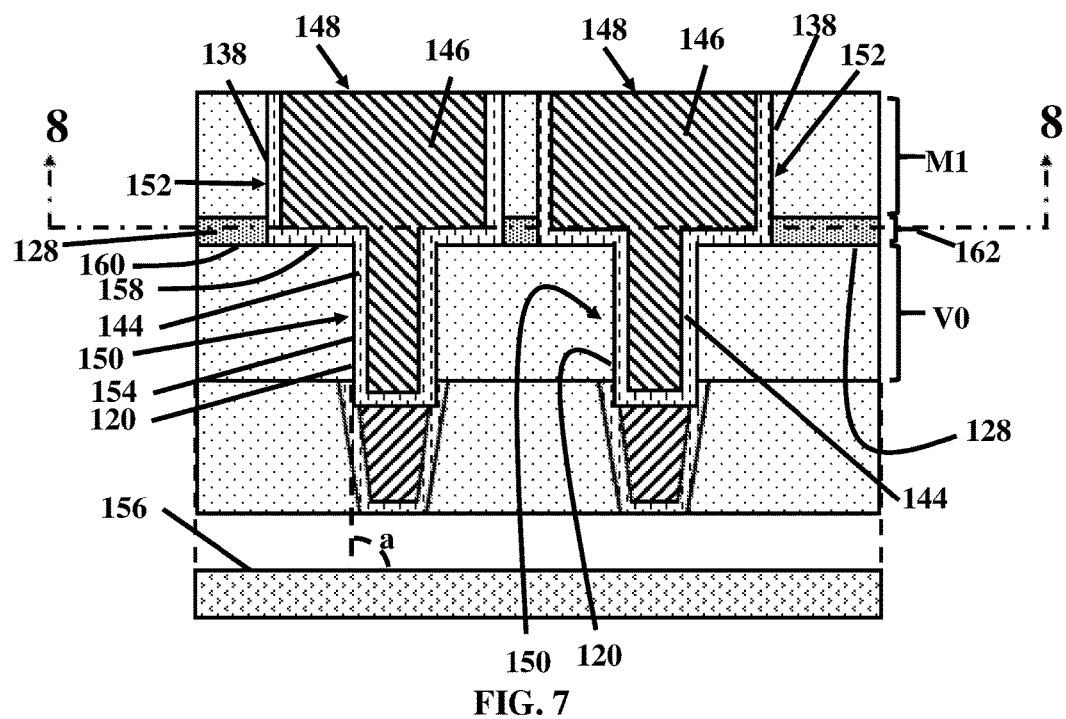
FIG. 7 shows a cross-sectional view of an interconnect structure, according to embodiments of the disclosure.

Turning next to FIG. 7, forming interconnect barrier metal liners 144 and a conductive material 146 is shown, according to embodiments of the disclosure. Interconnect barrier metal liners 144 and conductive material 146 may be formed to create the via structures and metal wires of interconnect structures 148. For example, interconnect barrier metal liners 144 and conductive material 146 may form second via structures 150 in second via openings 120 of initial via layer V0. Additionally, interconnect barrier metal liners 144 and conductive material 146 may form metal wires 152 in metal wire openings 138 of first metal layer M1 adjacent to ESL 128. Metal wires 152 may be positioned on second via structures 150. Interconnect structures 148 may be formed to electrically connect device structures in electrical communication with first via structures 108 with other device structures now shown. For example, second via structures 150 of interconnect structures 148 may contact upper portions 126 of first via structures 108 therebelow.

As shown in FIG. 7, interconnect barrier metal liners 144 may first be formed in second via openings 120 and metal wire openings 138. Conductive material 146 may next be formed on interconnect barrier metal liners 144 in second via openings 120 and metal wire openings 138. Interconnect barrier metal liners 144 may be formed, for example, by conformal deposition and/or any other now known or later developed semiconductor fabrication techniques for forming an interconnect liner. Interconnect barrier metal liners 144 may include conventional materials for an interconnect barrier metal liner, for example, titanium nitride (TiN), tantalum nitride (TaN), cobalt (Co), or ruthenium (Ru) and/or any other refractory metals such as tantalum (Ta), titanium (Ti), tungsten (W), iridium (Ir), rhodium (Rh) and platinum (Pt), etc., and/or mixtures thereof. Conductive material 146 may be formed on interconnect barrier metal liners 144 by conventional semiconductor fabrication techniques for forming a conductive material of a contact structure. For example, conductive material 146 may be formed by deposition and planarization. Conductive material 146 may include copper (Cu), tungsten (W), cobalt (Co), ruthenium (Ru), and/or any other now known or later developed conductive material.

As discussed above, first ESL 128 may prevent second via opening 120 from being further etched, altered, etc., during formation of metal wire openings 138 and the removal of patterned mask 134 (FIG. 4). First ESL 128 may therefore reduce the chamfer or angle 'a' of sidewalls 154 of the second via structures 150 with respect to horizontal upper surface 156 of substrate 102. As shown in FIG. 7, forming first ESL 128 may, in a non-limiting example, allow for second via structures 150 of the interconnect structure to be substantially chamferless. As used herein, a chamferless via may include a via structure having a sidewall at an angle of approximately 90 degrees from the horizontal upper surface of substrate 102. Forming first ESL 128 before forming first metal layer M0 may therefore also provide desirable spacing between metal wires 152 and second via structures 150; reduce shorts between metal wires 152 and second via structures 150; improve reliability (e.g., time dependent dielectric breakdown (TDDB)); and improve the overall performance of the resulting structure.

Figure 8:
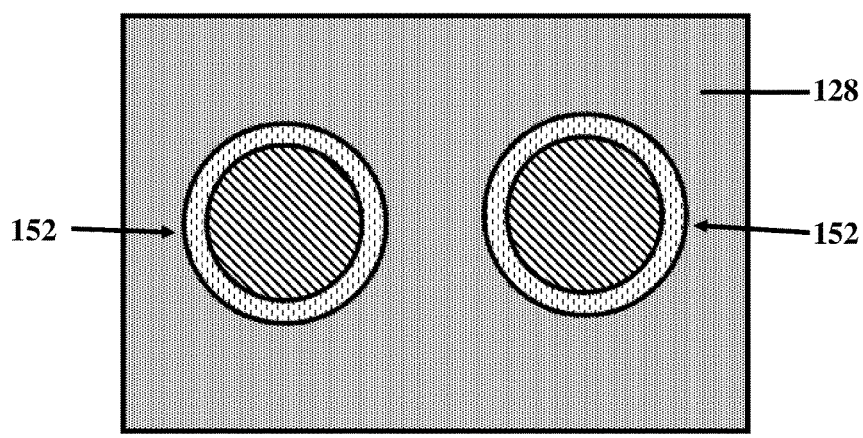
FIG. 8 shows a top view of the interconnect structure of FIG. 7 at structure line 8-8, according to embodiments of the disclosure.

Referring next to FIGS. 7 and 8 together, FIG. 8 shows a top view of FIG. 7 at structure line 8-8. As shown in FIG. 7, removing exposed portions 140 (FIG. 5) of first ESL 128 may cause a bottom extent 158 of metal wires 152 to be substantially co-planar with a bottom extent 160 of first ESL 128. Additionally, as shown in FIGS. 7 and 8, removing exposed portions 140 (FIG. 5) of first ESL 128 may cause first ESL 128 to surround bottom portions 162 of metal wires 152.

Figure 9:
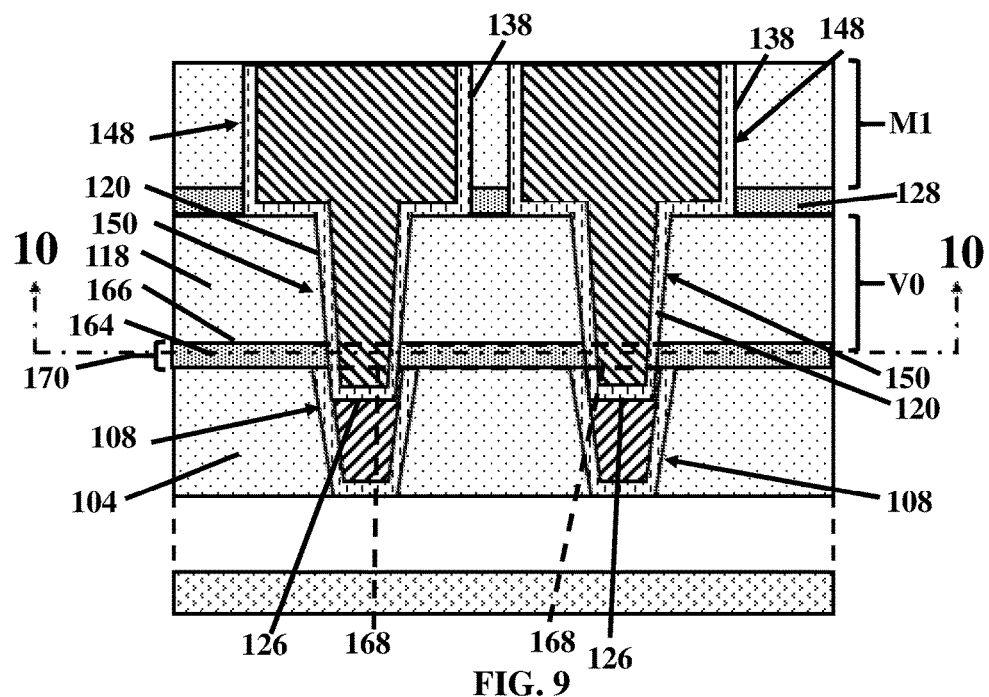
FIG. 9 shows a cross-sectional view of another interconnect structure, according to embodiments of the disclosure.

Turning next to FIG. 9, in another example, forming interconnect structure 148 may further include forming a second etch-stop layer (ESL) 164 on initial structure 100 of FIG. 1 before forming second dielectric layer 118 of FIG. 2. Second ESL 164 may prevent first via structures 108 from being removed, etched, altered, etc., during the formation of second via openings 120. Second ESL 164 may be formed on first dielectric layer 104 including first via structures 108 of initial structure 100 of FIG. 1 by the same and/or similar materials and methods as first ESL 128. For example, forming second ESL 164 may include depositing aluminum nitride (AlN), aluminum oxide (AlO), aluminum oxynitride, amorphous silicon (a-Si) and/or any other now known or later developed ESL material.

In the example of FIG. 9, after forming second ESL 164, second dielectric layer 118 may be formed thereon by the same and/or similar methods and materials as discussed above with respect to similarly number structures in FIG. 2. In contrast to the example of FIG. 2, forming second via openings 120 in second dielectric layer 118 in the example of FIG. 9 may include forming the via openings to an upper surface 166 of second ESL 164. For example, second ESL 164 may act as an etch stop for forming openings 120. Sacrificial semiconductor material 122 (FIG. 3) may then be formed in second via openings 120 and on upper surface 166 of second ESL 164. Sacrificial semiconductor material 122 may be formed by the same and/or similar processes and materials as discussed above with respect to FIG. 3.

As further shown in FIG. 9, first ESL 128, and first metal layer M0 including metal wire openings 138 may next be formed on initial via layer V0 by the same and/or similar processes as discussed above with respect to similarly numbered structures in FIGS. 2-5. In contrast to the example of FIG. 6, forming interconnect structures 148 may further include removing an exposed portions 168 (in phantom) of second ESL 164 after removing exposed portions 140 (FIG. 5) of first ESL 128, and sacrificial semiconductor material 122 (FIG. 5). Removing exposed portions 168 (in phantom) of second ESL 164 may include expose upper portions 126 of first via structures 108. As shown in FIG. 9, after removing exposed portions 168 (in phantom) of second ESL 164, the remainder of interconnect structures 148 may be formed by the same and/or similar methods as discussed above with respect to similarly number structures in FIG. 7.

Figure 10:
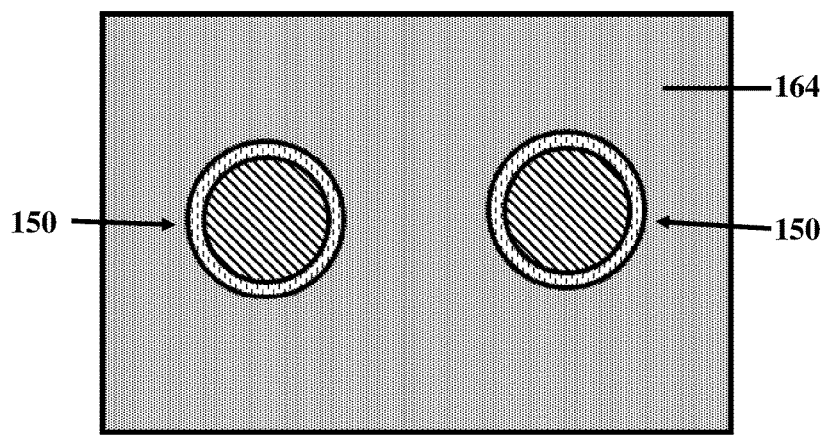
FIG. 10 shows a top view of the interconnect structure of FIG. 9 at structure line 10-10, according to embodiments of the disclosure.

Referring next to FIGS. 9 and 10 together, FIG. 10 shows a top view of FIG. 9 at structure line 10-10. As shown in FIG. 9, removing exposed portions 168 (in phantom) of second ESL 164 may cause portions 170 of second via structures 150 to be adjacent to second ESL 164. Additionally, as shown in FIGS. 9 and 10, removing exposed portions 168 (in phantom) of second ESL 164 may cause second ESL 164 to surround portions 170 of second via structures 150.

Although the examples of FIGS. 1-10 show forming two interconnect structures 148 on first via structures 108, it should be understood that any number of interconnect structures in any location may be formed on any desirable device structure, according to embodiments of the disclosure.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   forming a first dielectric layer above a substrate;
   forming a via opening in the first dielectric layer;
   filling the via opening with a sacrificial semiconductor material;
   forming a first layer on the first dielectric layer and the sacrificial semiconductor material;
   forming a second dielectric layer on the first layer;
   forming a wire opening in the second dielectric layer to expose a portion of the first layer, the wire opening positioned above the sacrificial semiconductor material in the first dielectric layer;
   removing the exposed portion of the first layer to expose an upper surface of the sacrificial semiconductor material;
   removing the sacrificial semiconductor material from the via opening; and
   forming a conductive material in the via opening and the wire opening to form an interconnect structure.

2. The method of claim 1, further comprising planarizing the sacrificial semiconductor material and the second dielectric layer before forming the first layer.

3. The method of claim 1, wherein forming first dielectric layer includes forming the first dielectric layer above a third dielectric layer positioned on the substrate, the third dielectric layer including a via structure positioned therein.

4. The method of claim 3, wherein forming the via opening in includes exposing an upper surface of the via structure.

5. The method of claim 3, further comprising, before forming the first dielectric layer above the third dielectric layer, forming a second layer on the third dielectric layer, wherein forming the first dielectric layer includes forming the first dielectric layer on the second layer.

6. The method of claim 5, wherein forming the via opening includes exposing and removing a portion of the second layer to expose an upper surface of the via structure.

7. The method of claim 1, wherein forming the wire opening includes forming a hard mask on the second dielectric layer, and etching the wire opening in the second dielectric layer.

8. The method of claim 7, further comprising removing the hard mask after forming the wire opening.

9. The method of claim 8, wherein the first layer remains above the sacrificial semiconductor material during the removal of the hard mask.

10. The method of claim 9, wherein the hard mask includes titanium nitride.

11. The method of claim 1, wherein the first layer acts as an etch stop during the formation of the wire opening.

12. The method of claim 1, wherein the first layer includes a low temperature oxide.

13. A method of forming an interconnect, the method comprising:
    forming a first dielectric layer above a substrate
    forming a first via in the first dielectric;
    forming a second dielectric layer above the first dielectric layer;

forming a via opening in the second dielectric layer above the first via;

forming a sacrificial semiconductor material in the via opening;

forming a first layer on the second dielectric layer and the sacrificial semiconductor material;

forming a third dielectric layer on the first layer;

forming a wire opening in the third dielectric layer to expose a portion of the first layer, the wire opening positioned above the sacrificial semiconductor material;

removing the exposed portion of the first layer to expose the sacrificial semiconductor material;

removing the sacrificial semiconductor material from the via opening to expose an upper surface of the first via in the first dielectric layer; and forming a conductive material in the via opening and the wire opening to form the interconnect on the first via, the interconnect including a second via and a first wire.

14. The method of claim 13, further comprising forming a second layer on the first dielectric layer before forming the second dielectric layer.

15. The method of claim 14, further comprising removing a portion of the second layer to expose the upper surface of the first via before forming the conductive material in the via opening and the wire opening.

16. The method of claim 13, wherein the first layer acts as an etch stop during the formation of the wire opening.

17. The method of claim 13, wherein the first layer includes a low temperature oxide.

* * * * *